United States Patent [19]

Wells, Jr. et al.

[11] 4,238,728
[45] Dec. 9, 1980

[54] VOLTAGE TESTER HOUSING WITH PROD RETAINING CHANNELS

[75] Inventors: Peter M. Wells, Jr.; Johannes A. E. Oprins, both of Sycamore, Ill.

[73] Assignee: Ideal Industries, Inc., Sycamore, Ill.

[21] Appl. No.: 877,232

[22] Filed: Feb. 13, 1978

[51] Int. Cl.² ............................ G01R 1/06; G01R 1/04
[52] U.S. Cl. ..................... 324/149; 324/51; 324/72.5
[58] Field of Search ............... 324/51, 72.5, 133, 149, 324/53; 361/399; 362/200–208, 194, 195, 369, 370; 429/96–100

[56] References Cited

U.S. PATENT DOCUMENTS

| | | | |
|---|---|---|---|
| 1,599,113 | 9/1926 | Cargill et al. | 362/204 |
| 2,205,477 | 6/1940 | James | 324/53 |
| 2,260,639 | 10/1941 | Powell | 362/369 X |
| 2,581,497 | 1/1952 | Podell | 324/149 UX |
| 2,586,203 | 2/1952 | Boyle | 324/149 X |
| 2,791,748 | 5/1957 | Mitchell | 324/149 |
| 2,842,741 | 7/1958 | Simkins | 324/149 |
| 3,214,689 | 10/1965 | Outen | 324/51 |
| 3,281,671 | 10/1966 | Hughson | 324/51 |
| 3,513,388 | 5/1970 | Strachan | 324/149 X |
| 3,553,572 | 1/1971 | Harmon | 324/53 |
| 3,555,420 | 1/1971 | Schwartz | 324/149 |
| 3,757,218 | 9/1973 | Oliverio et al. | 324/149 X |
| 3,840,808 | 10/1974 | Liebermann | 324/149 X |
| 4,006,409 | 2/1977 | Adams | 324/72.5 X |
| 4,027,236 | 5/1977 | Stewart | 324/72.5 X |
| 4,074,122 | 2/1978 | Moore | 362/200 |
| 4,084,134 | 4/1978 | Nagano | 324/72.5 X |

FOREIGN PATENT DOCUMENTS 693253 6/1953 United Kingdom ................ 324/53

*Primary Examiner*—Gerard R. Strecker
*Attorney, Agent, or Firm*—Kinzer, Plyer, Dorn & McEachran

[57] ABSTRACT

An electrical testing device having a housing and a testing circuit in the housing. Electric leads extend from the housing, ending with exposed contacts mounted in prod handles. Channels are formed in the sides of the housing affording a mounting location for storage of the prod handles. Each channel can also be used as a prod holder when the device is being used. Circuitry is provided for testing continuity of the leads and for indicating the presence of a potentially harmful or dangerous voltage.

14 Claims, 9 Drawing Figures

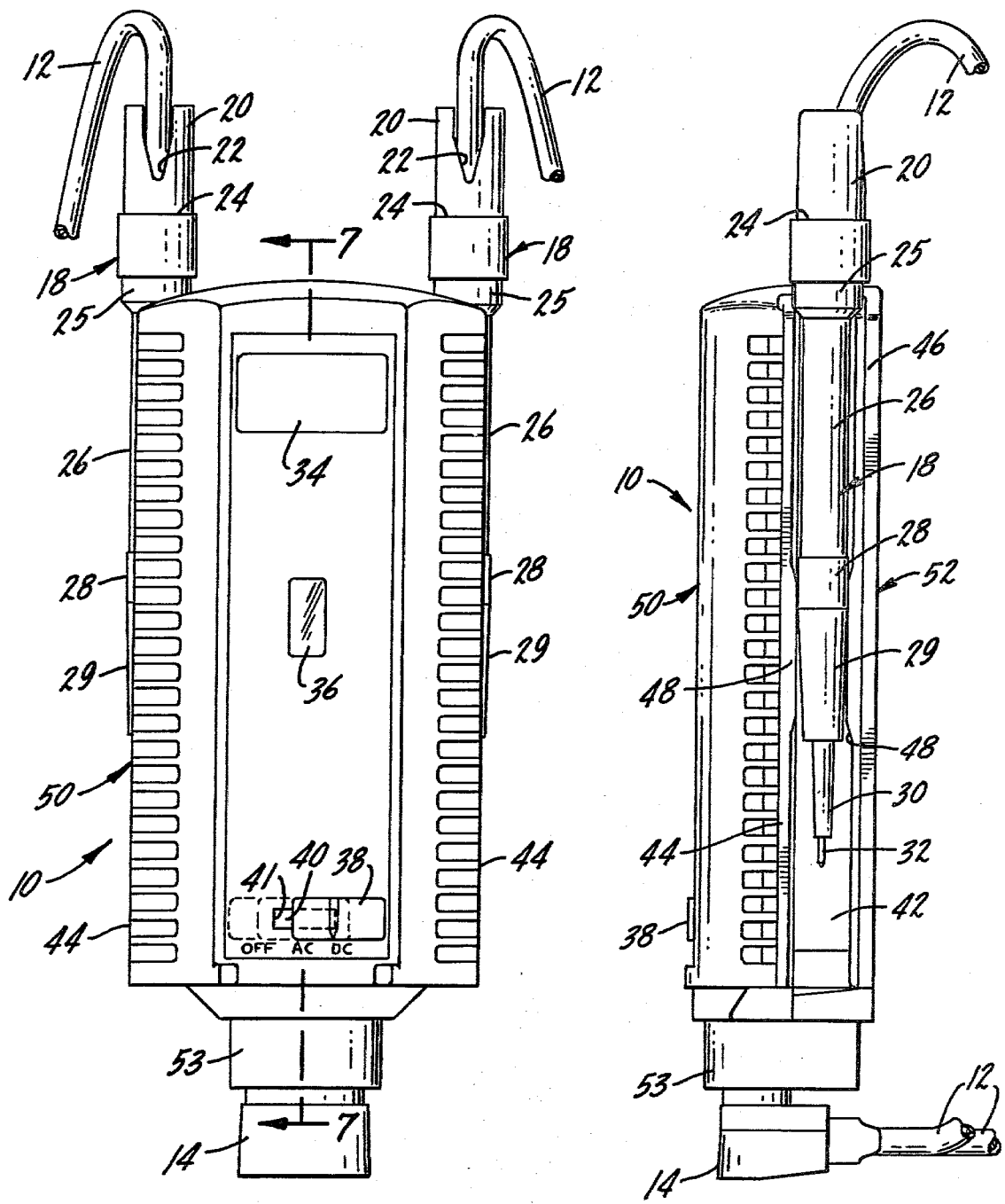

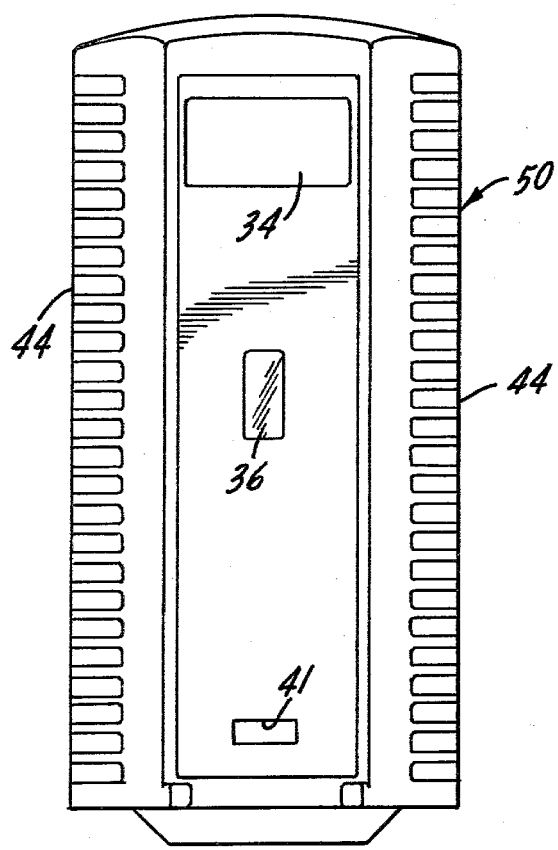
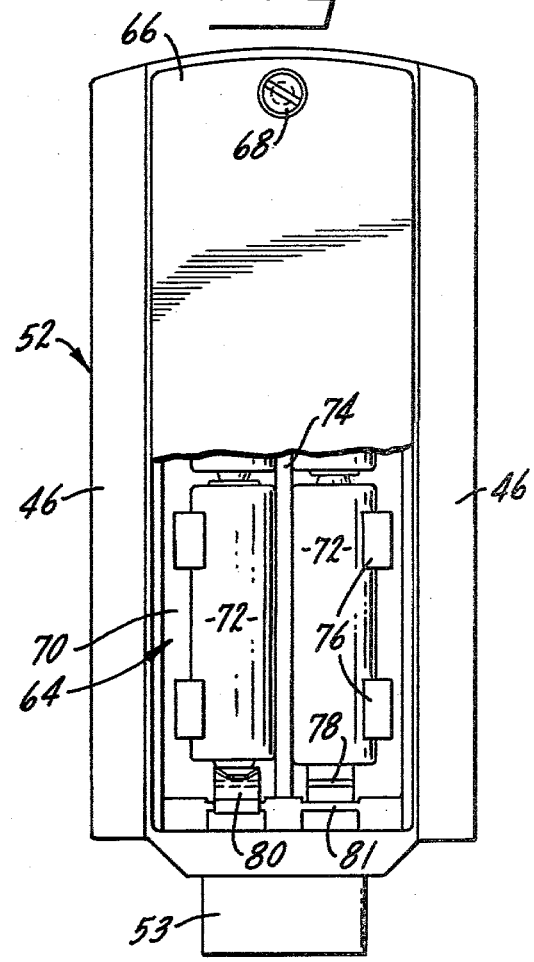
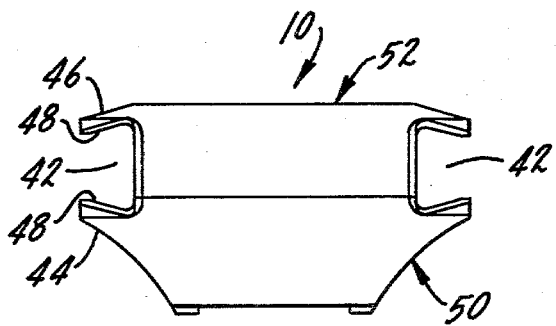
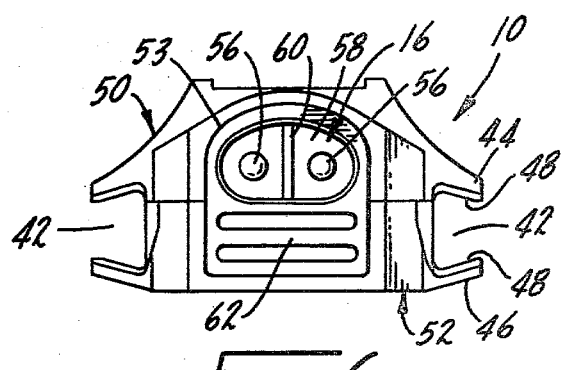

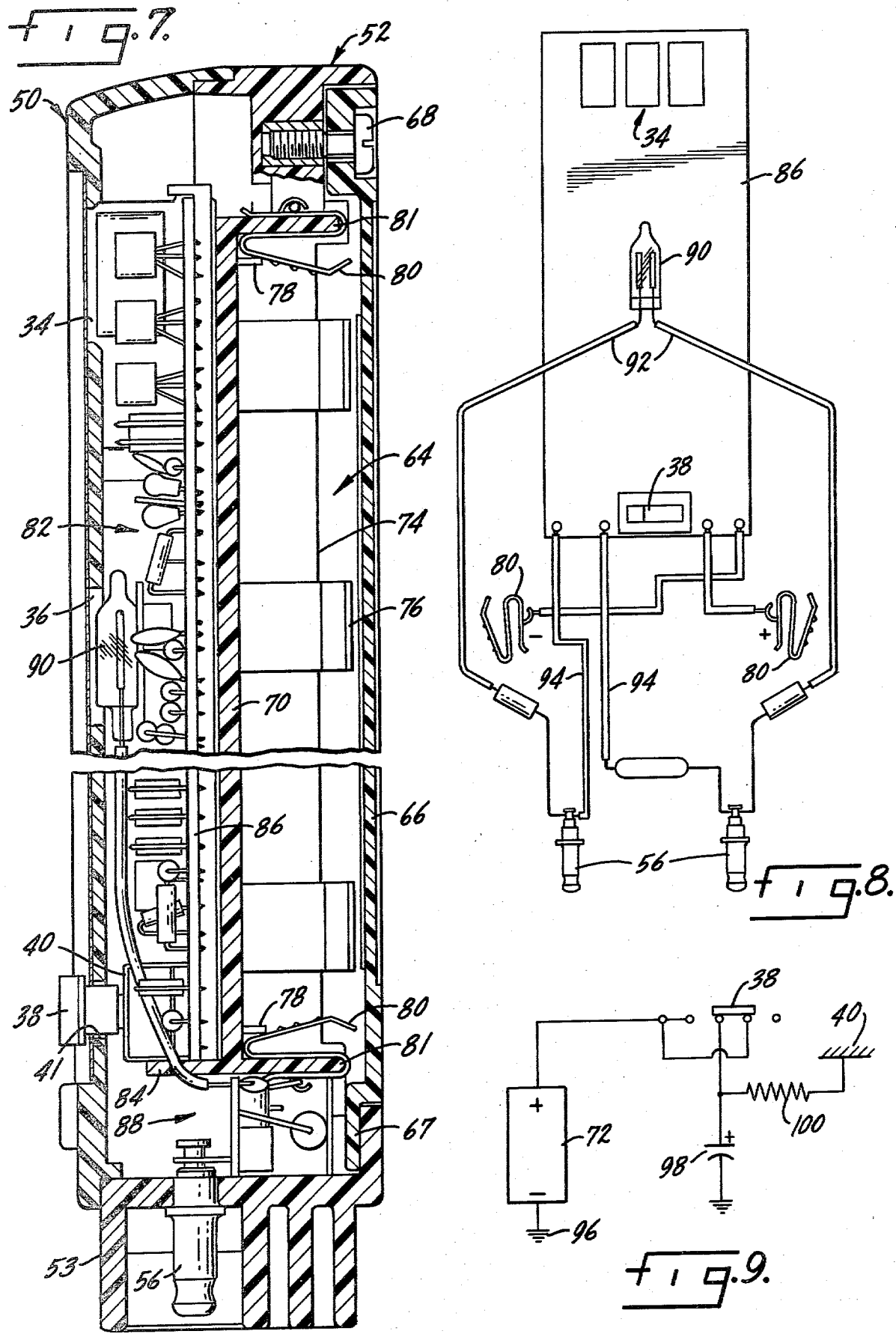

VOLTAGE TESTER HOUSING WITH PROD RETAINING CHANNELS

BACKGROUND OF THE INVENTION

This invention relates to electrical testing equipment and more particularly, to an improved housing for a voltage tester or voltmeter.

One of the components in a voltage tester is a pair of insulated electrical leads fitted with prod handles having contacts at the ends for connection to the points where the voltage is to be measured. The presence of these leads creates a problem of what to do with them when the tester is not in use. Also, in hand held units, the user has to manipulate the two prod handles in addition to the tester itself. Thus, the user has three items to hold in two hands. These problems were addressed in Mitchell, U.S. Pat. No. 2,791,748. Mitchell teaches the use of fully enclosed tubular passages integrally formed in the housing of the tester. The passages house the prod handles when they are not in use. The tips of the handles are wedged in the bottom of the passage to hold them in. Mitchell also uses a socketing means in the housing for mounting the base end of a prod handle so the tester housing and mounted prod can be manipulated as a unit.

The disadvantages of the tubular passages in Mitchell are that they are difficult to manufacture and they do not securely hold the prod handles. The metallic prod is easily dislodged from its wedging abutment so the handles become free to fall out of the passages if the unit is not held upright.

Another difficulty attendant with the voltage tester leads is they are prone to failure. The leads are typically subjected to rough handling such as yanking them out of test locations and picking the tester up by the leads. Locations particularly vulnerable to electrical failure are the junction between the contact pin in the prod handle and the lead wire, and the point where the lead wire enters the tester housing. In the past, there has been no way to make sure the leads have not been damaged. This becomes particularly critical in the field where the tester is used to detect the presence of a voltage before an electrician starts working on a system.

SUMMARY OF THE INVENTION

A primary object of this invention is a voltage tester housing which readily facilitates storage and mounting of its electric leads' prod handles.

Another object is the provision of means for performing a lead test to assure that the leads have not been damaged.

Another object is a hand-held, battery-powered voltage tester having means for readily testing the strength of the batteries.

Another object is a voltage tester having an auxiliary circuit which will indicate the presence of a potentially harmful voltage even if the main tester circuit fails to do so.

Accordingly, an electrical testing device is provided which has a housing and an electrical testing circuit mounted inside the housing. A pair of insulated leads is connected at one end to the testing circuit with the leads extending through the housing. The other ends of the leads have exposed contact pins mounted in prod handles. The housing also has flanges extending along its side edges. Each flange is in facing relation with another flange to define a channel between them. The prod handles are insertable into this channel for storage or for establishing a prod mounting which the user can manipulate as a unit with the tester housing.

There is also provided on the housing a switch which is actuatable to a position which exposes a contact plate or ground. The contact plate is connected to a lead testing circuit so that sequential placement of the prods against the contact plate will cause the tester to indicate whether there is electrical continuity in the leads.

An additional safety feature is the inclusion of a neon indicator bulb across which is placed to measure voltage. The bulb is designed to glow when subjected to a threshhold voltage. The neon bulb will glow regardless of the operability of the rest of the tester circuit.

BRIEF DESCRIPTION OF THE DRAWINGS

FIG. 1 is a front elevation of the testing device with the prod handles mounted for storage therein;

FIG. 2 is a side view of the device;

FIG. 3 is a front elevation of the housing cover;

FIG. 4 is a back elevation of the housing casing with a portion of the battery cover removed to reveal the battery compartment;

FIG. 5 is a top plan view of the testing device;

FIG. 6 is a bottom plan view of the device with the leads removed;

FIG. 7 is a section along line 7—7 of FIG. 1;

FIG. 8 is a partial circuit; and

FIG. 9 is another partial circuit.

DESCRIPTION OF THE PREFERRED EMBODIMENT

FIGS. 1 and 2 show the basic structure of the testing device. In a preferred embodiment, the device is a digital voltage tester or voltmeter, capable of measuring AC or DC voltages. The device is battery powered and is small enough to be hand held. The relatively flat configuration of the housing fits readily into the palm of the user's hand.

A housing 10 encloses the batteries and the testing-circuit assembly. The details of the electrical circuitry are described in U.S. Pat. No. 4,127,810, issued Nov. 28, 1978.

Insulated electric leads 12 are connected through the bottom of the housing to the electrical testing circuit. This connection is effected by means of a plug 14 which fits into a socket 16 (see FIG. 6) in the bottom of the housing. The opposite ends of the leads are connected to prod handles 18. The prod handles are made of a resilient plastic material and include a base 20 with notches 22 cut on either side. The base terminates at a shoulder 24 and a pilot 25 on the other side. The shank 26 of the prod handles has a collar or enlargement 28 with a forward taper 29 toward the other end of the prod handles. A sleeve 30 covers the electrically-conductive contact pin 32. The sleeve can be made to be retractable into the collar to permit insertion of the contact pin into small spaces and is spring-biased to return to its normal location.

The front of the housing has a display window 34 behind which is located the display device of the electrical testing circuit, in this case a digital readout. Another indicator window 36 is provided in the middle of the tester. Behind it is located a neon indicator bulb whose function will be explained below in connection with FIG. 8. Switch 38 selects either the AC or DC mode of operation or turns the unit off and has various positions as shown in FIG. 1. When the switch is in its DC position, if exposes a contact or switch plate 40 through an opening 41 in the housing which is normally covered by the switch when it is in its "OFF" and "AC" positions. This opening and switch plate contact is used in connection with a battery and lead testing procedure which will be explained below.

The prod handles 18 are shown in their storage position in channels 42 in FIGS. 1 and 2. These channels are formed on opposite edges or sides of the housing by flanges 44 and 46 which are integrally molded in housing 10. The entire housing is made of resilient plastic material which permits the flanges to flex somewhat which action produces the releasable clamping force that holds the prod handles in the channel. Each flange has an offset portion or restriction 48 at or near the middle of the flange which narrows the width of the channel. This channel width is somewhat less than the maximum diameter of the collar 28 so when the collar is wedged between the offset portions 48, it spreads the flanges apart slightly until the collar snaps down between the offset portions to securely hold the prod handles in the channels. This clamping action can be brought about by inserting the prod handle from either end of the channel or by simply snapping the collar directly between the flanges by a sideways squeezing motion. The prod handles become securely fastened in the channels and will not come out until the user releases them by pulling the prod handle longitudinally out of the channel or by flexing them sideways in a snapping-out action. This provides a quick, easy and positive means for storing the prod handles when the user is finished with the tester. Note that the prod handles can be stored in either direction, which is to say from either end since the channels 42 are open at both ends.

The channels 42 also provide a place to mount the prod handles for use. Since this is a hand-held unit, a combination of the housing and at least one of the prods is necessary during use, otherwise, the housing would have to be set down while the user manipulated the prod handles. This would be most inconvenient as it is not likely there will be a place available to set the tester housing.

The mounting is attained by inverting the prod handles from the position as shown in FIGS. 1 and 2 and inserting the prod base 20 into the channel 42. The notches 22 in the base permit the base to be squeezed together or flexed inwardly somewhat to provide a tapered effect that allows the base to slide in between the flanges 44 and 46 at either end of the housing. Where the notches end, however, the base is fairly rigid so the flanges are flexed apart to permit insertion of the base. The depth of insertion is limited by the shoulders 24 abutting against the ends of the flanges. This mounting can be established at either end of the channel 42.

The housing 10 is made up of two housing halves, a housing cover 50, and a casing 52, which are permanently joined together ultrasonically, by an adhesive or the like. The casing 52 has an extension 53 which underlies the lower part of the cover 50 and closes the lower end thereof. The cover flanges 44 are integrally formed in the housing cover 50 while the casing flanges 46 are formed in the casing. When the two halves are brought together, the flanges are arranged in facing relation to each other to form the channels 42.

FIGS. 3 and 4 show the housing cover 50 and a casing 52, respectively. As can be seen, the socket 16 is formed in the casing extension 53. The socket in this embodiment is of the male type with contact prongs 56 located in an enclosure 58 which is divided by a partition 60 (FIG. 6). The plug 14 fits snugly into the enclosure 58. A rib 62 adds extra rigidity to the socket and simplifies molding. This use of a detachable plug allows the replacement of damaged leads without having to open up the housing and reconnect the leads to the circuit assembly.

Returning to FIG. 4, a battery compartment is shown generally at 64. A battery cover 66, which is held in place by a tongue and slot 67 at the bottom and a screw 68 at the top, normally covers or closes the battery compartment. This is at what would be normally considered the back of the tester housing. The battery compartment has a floor or back wall 70 on which the batteries 72 rest. A dividing wall 74 partitions the battery chamber into a pair of channels each of which holds a pair of series-connected batteries. Holder clips or fingers 76, integrally formed in the back wall extend into the battery chamber on each side of the pair of channels, each of which holds two batteries. The fingers or clips can flex laterally to allow the batteries to snap into place between the clips and the dividing wall. The holder clips and dividing wall form, in effect, one or more channels which restrict the batteries to longitudinal motion. Sliding of the batteries is restricted or controlled by stops 78 at each end of the channels. These stops may be small abutments formed in the floor of the compartment. Their function is to prevent damage to the spring-type contact metal clips 80 mounted on walls or risers 81 at each end of the channels. These clips are provided at the terminals of the series-connected batteries 72. Their spring bias assures constant contact with the terminals while permitting sufficient flexibility to have the batteries inserted between the clips. The stops 78 protect the contact clips against excessive inertial loading, for example, if the tester is dropped.

FIGS. 5 and 6 show plan views of the housing ends to show how the housing halves 50 and 52 fit together side by side to form the housing 10 and channels 42.

In FIG. 7 the two housing halves 50 and 52 are shown as brought together with the battery cover 66 in place. In this form and from a cetain point of view the housing may be considered to be made up of three parts, two outer parts and an intermediate part, with one of the outer parts and the intermediate part being permanently joined, as by ultrasonic welding, adhesive, etc., and the other outer part being removably connected to the intermediate part. Chambers are defined between the intermediate part and each of its outer parts. For example, the outer part that is permanently connected to the intermediate part defines a circuit chamber 82 and the other outer part, which is the battery cover 66, defines a battery chamber or compartment 64. The two chambers, in effect, are separated by a longitudinal wall 70 which has uprights or projecting walls at each end which project into each compartment. For example, the uprights or walls 81 project into the battery compartment and serve to support and position the contact clips 80 for the batteries. Corresponding projections 84 extend into the circuit compartment and serve to position a circuit board 86 which may have suitable electrical components and a printed circuit, some of which is shown but may be conventional and is not explained in detail. Rather, the details of the circuit are shown in U.S. Pat. No. 4,127,810, issued Nov. 28, 1978. The lower most walls or projections 81-84 define a channel 88 through the bottom of the housing which communicates or provides communication between the two compartments. The lower end of the channel or passage 88 is closed by the enlargement or lug 53 on the housing half or intermediate 52.

A neon bulb 90 is positioned so as to be visible through the opening 36. A schematic of the circuit is shown in FIG. 8 with the bulb 90 superimposed against the circuit board 86 with suitable leads 92 running to the contacts or prongs 56 with suitable resistors as needed. The battery circuit in FIG. 8 is indicated by the spring clips 80 with suitable leads 94 connecting the circuit 86 to the plugs or prongs 56. It will thus be seen that the circuit for the neon bulb is in parallel with the voltmeter circuit and each is connected to the electrodes or prods. The neon bulb is the type that will break down or be energized at a specific voltage level, for example 80 volts or greater. The bulb has two filaments and will indicate whether the contact prods are connected with either AC or DC current. For example, if the prods are in contact with a DC current, one filament will glow. If its connected with an AC current, both filaments will glow. The neon bulb will also indicate polarity since the sides of the housing opposite window 36 may be marked, for example color-coded red and black and, when in contact with a DC current, depending upon which filament glows, the red or the black, the user will know polarity.

As shown in FIG. 1, the switch 38 has OFF, AC and DC positions. The switch 38 has also been shown schematically in FIG. 8 on the circuit board. Various dotted line positions are shown in FIG. 1. The solid line position is the DC position, which is the farthest to the right in this particular form and uncovers an opening 41 which exposes a switch contact plate or ground 40. This plate is a ground which lets the user know that the leads have proper continuity. The testing procedure consists of moving the switch to the DC position, at which point the display 34 should read zero or one volt. Then the negative lead or prod may be inserted through the opening and placed in contact with the switch or contact plate 40. At this point the display will read the voltage of the batteries which should be something on the order or 5 or 6 volts. Then, the other lead or prod may be inserted through the opening and put in the contact with the contact or switch plate or ground, which should return the reading to zero or one volt, which will indicate that the leads both have electrical continuity. Otherwise, not. It goes without saying that depending upon the reading when the batteries are being checked by the use of one contact, battery strength will be indicated. If when the negative prod or contact is placed against the contact plate or switch plate or ground, the reading is not high enough, the user will know that the batteries are losing strength and should be replaced.

In FIG. 9 a schematic circuit is shown in which the battery is indicated at 72 and has one side connected to the ground, as at 96. The positive terminal of the battery is connected to the switch 38, with one of the switch poles being connected through a capacitor 98 to ground. A small resistor, for example 1K, indicated at 100, is connected to ground in a convenient location, for example the front 40 of the switch. To test lead continuity, the positive probe is placed against the switch frame 40 through the opening 41 in FIG. 1. As explained hereinbefore, the display should show battery voltage, assuming there is continuity through the positive probe.

As mentioned before, if the negative probe is then inserted through the opening 41 and placed in contact with the switch frame 40, the display should go to zero, which would then indicate that both the positive and negative probes have continuity. Without a reliable means for checking lead continuity, an electrician could well consider there to be no voltage present, when in fact there could be a substantial voltage.

The circuitry has the advantage that when the switch 38 is in the "OFF" position and the prods are inserted into a receptacle, if both filaments in the neon bulb glow, it's an AC circuit. If only one or the other filament glows, it's a DC circuit and the user will know polarity, depending upon which filament glows.

If the user puts the switch 38 in the AC position and inadvertently plugs the probes into a DC socket, he will get a very low reading on the readout or display 34, something on the order of 8 or 9 volts. He should then known that this is wrong because the neon bulb 90 is set to break down at a higher threshold level, for example 80 volts. The same thing will be true if he has the switch 38 in its "DC" position. When the neon bulb glows, be it one filament or both, the user knows that there is at least a certain voltage regardless of what the display readout 34 indicates. This is true because the neon bulb 90 is connected in parallel with the digital circuit. This will prevent or avoid the danger that might arise from a user thinking that a line has no voltage when actually the low voltage reading was caused by a malfunction, an overload of the tester, improper use of the tester, weak batteries, or what-have-you.

The use, operation and function of the invention are as follows:

The invention takes on the character of a voltage tester, preferably of the digital type, although many of the features and characteristics are not necessarily restricted thereto. Some of the features may be used in other types of voltage testers. The housing is basically made up of two parts or halves, although, from a certain point of view, it may be considered a three-part housing. For example, the back cover 66 which closes the battery chamber 64, may be considered a third part so that the casing is made up of front and back parts with an intermediate part. The front and intermediate part define a chamber 82 for the voltage tester circuit and the intermediate and back parts define the battery chamber. The front and intermediate parts are permanently connected while the back part or cover is removable so that the batteries in the chamber may be changed from time to time.

From another point of view, the housing may be considered as merely a two-part housing, with the second or back part having an openable compartment for the batteries.

In any event, the case is somewhat elongated and has open-sided channels along each edge thereof which receive the prod handles. It will be noted that the channels are open throughout their length so that the handles may be inserted from either end and, for removal, merely require flexing outwardly so that they are flexed out through the sides instead of being withdrawn from or toward either end. But the prods may also be removed by endwise withdrawal. The interference-fit intermediate the ends of the channels, which is provided or acquired between enlargements, such as shown in FIG. 6, in the channel, to provide an inward wedging state or condition ensure that the prods will be held in place. The dimensioning is such that when the prod is fully inserted, as shown in FIG. 2, so that the enlargement is fully wedged in the restriction, the pilot 25 at the other end engages the channel entrance so that the prod handle, in effect, has a two-point mounting or connection.

The battery chamber is constructed with integral spring clips or fingers 76 which releasably hold the batteries in place. In the form shown and described, two battery channels, side-by-side, are formed with two batteries in each channel, making a total of four. But there may be more or less. Spring metal clips for contacting the ends of the batteries are disposed at each end of the channels and stops or abutments are used or positioned so that the inertia or impact of the batteries, for example if the case is dropped or thrown, will be taken by the stops without compressing the spring clips excessively, which will otherwise shorten their life. This is of particular advantage where aligned batteries are used since their combined inertia could be substantial.

The testing arrangement in which the switch on the housing is movable between three positions, an OFF position, an AC position, and a DC position, and has particular advantage in that in the "DC" position an opening in the plastic housing is uncovered which allows the top prod contact to be inserted and grounded which gives a visual indication of the battery strength and continuity checking.

While the preferred form of the invention has been shown and described, it should be understood that additional modifications, changes or alterations may be made without departing from the invention's fundamental theme. For example, the channels formed in the housing are suitable for use in any type of testing device employing electrical prods. Their application is not limited to voltage testers. It is, therefore, wished that the invention be unrestricted except as by the following claims.

The embodiments of the invention in which an exclusive property or privilege is claimed are defined as follows:

1. In a voltmeter, a housing with a voltmeter circuit therein, leads from the housing extending from one end thereof with handles and test prods on the ends of the leads, two open-sided, open-ended channels extending longitudinally along opposite sides of the housing, each channel being formed by a pair of oppositely facing resilient flanges extending along substantially the entire length of said housing and constructed and arranged to accept one of the handles from either end or from the side of said channel for storage, a reduction in the cross section of the channel intermediate its ends, an enlargement on each of the handles intermediate its ends, the dimensioning of the reduction and enlargement being such that an interference fit is acquired when the handle is fully inserted into the channel and the positioning of the reduction and enlargement along the length of the channel and the handle being such that a portion of the handle end extends beyond the channel when the handle is fully inserted into the channel.

2. The structure of claim 1 further characterized in that each of the prod handles and channels have interference fits and are constructed and arranged so that the prods can be removed laterally.

3. The structure of claim 1 in which the reduction is of limited longitudinal extent and is positioned generally intermediate the ends of the channels with the enlargement being toward the test prod.

4. The structure of claim 3 further characterized by and including a shoulder on each of the handles toward the leads and dimensioned so that the shoulder engages the otherwise open end of the channel after the interference fit has taken effect when the handle is fully inserted into the channel.

5. The structure of claim 4 further characterized in that the dimensioning is such that the interference fit takes effect as the shoulder engages the end of the channel when the handle is inserted from either end.

6. An electrical testing device comprising a housing, an electrical testing circuit assembly mounted in the housing, the housing being made up of three generally elongated parts, first and second outside parts and an intermediate part with the first and intermediate parts being thermally joined together and defining a circuit chamber between them and enclosing the testing circuit assembly, the intermediate part having a base extension that extends laterally under the first outside part to close the lower end thereof and to thereby define a part of the circuit chamber, a pair of insulated leads having exposed contacts mounted in prod handles at one end of the leads, the other ends being connected through the housing to the testing circuit assembly, the housing having flanges extending along the side edges thereof, each flange being in facing relation with another flange to define a channel therebetween into which channel can be inserted a prod handle for storage or for establishing a prod mounting which the user can manipulate as a unit with the tester housing, and a socket formation integrally formed in the base extension longitudinally opposite the circuit chamber for detachably connecting the leads to the testing circuit assembly.

7. The structure of claim 6 wherein the housing comprises two side-by-side housing halves each having a flange in facing but spaced relation with a flange on the opposite housing half to define each channel which are open-sided laterally.

8. The structure of claim 6 wherein the housing comprises a casing and a cover which fits thereon, the casing further comprising a battery compartment for containing a plurality of batteries, one side of the casing being open to provide access to the compartment, a removable battery cover which can be replaced to cover the open side of the casing and enclose the battery compartment.

9. The structure of claim 8 wherein the battery compartment comprises a spring-type battery contact clips arranged to maintain electrical connection with the battery terminals while providing sufficient flexibility for a snap-fit insertion of batteries therebetween, each contact clip being protected by a stop which limits the extent to which the batteries can slide in the compartment, thereby preventing excessive loading of the spring contact clips by the batteries in the event the testing device is dropped.

10. The structure of claim 9 wherein the battery compartment further comprises a floor on which rest two pairs of series-connected batteries, a dividing wall between the battery pairs, resilient holder clips which prevent lateral rolling motion of the batteries, upraised projections on the floor which serve as protective stops, the floor, dividing wall, holder clips and stops defining channels which hold the batteries in alignment between the contact clips.

11. The structure of claim 8 wherein the pair of insulated leads is connected to a plug at the end opposite the prod handles, the plug being insertable into the socket means to effect electrical connection between the leads and the testing circuit assembly.

12. The structure of claim 6 wherein the flanges have upset portions in the middle thereof which narrow the channel width so that when the prod handles are inserted into the channel for storage the handles can be wedged between the upset portions to firmly anchor the prod in the channel.

13. The structure of claim 6 wherein the flanges are made of a resilient plastic with the channel and prod handle widths such that the flanges must be flexed apart to receive the prod handles therebetween thus effecting a tight clamping of the prod in the channel.

14. The structure of claim 13 wherein the prod handles have a base which is generally cylindrical with notches cut in opposing sides to lend flexibility so the base can be squeezed together slightly upon insertion into the channel.

* * * * *